United States Patent
Lee

(10) Patent No.: US 10,451,678 B2
(45) Date of Patent: Oct. 22, 2019

(54) BATTERY SYSTEM IDENTIFICATION THROUGH IMPULSE INJECTION

(71) Applicant: Ford Global Technologies, LLC, Dearborn, MI (US)

(72) Inventor: Tae-Kyung Lee, Ann Arbor, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 703 days.

(21) Appl. No.: 14/334,364

(22) Filed: Jul. 17, 2014

(65) Prior Publication Data

US 2016/0018471 A1    Jan. 21, 2016

(51) Int. Cl.
*G01R 31/36* (2019.01)
*G01R 31/00* (2006.01)
*G01R 31/367* (2019.01)
*G01R 31/385* (2019.01)

(52) U.S. Cl.
CPC ....... *G01R 31/3648* (2013.01); *G01R 31/367* (2019.01); *G01R 31/007* (2013.01); *G01R 31/385* (2019.01)

(58) Field of Classification Search
CPC ............ G01R 31/3648; G01R 31/3651; G01R 31/007; G01R 31/3627; G01R 19/0053; G01R 31/3606–31/3696; H04L 25/0248
USPC .................. 702/63; 320/106, 109, 132, 145; 324/428, 430
See application file for complete search history.

(56) References Cited

U.S. PATENT DOCUMENTS

| | | | |
|---|---|---|---|
| 5,444,378 A * | 8/1995 | Rogers | G01R 31/3613 320/136 |
| 6,441,586 B1 | 8/2002 | Tate, Jr. et al. | |
| 6,534,954 B1 * | 3/2003 | Plett | G01R 31/3651 320/132 |
| 7,136,763 B2 | 11/2006 | Tate, Jr. | |
| 7,969,120 B2 | 6/2011 | Plett | |
| 8,447,544 B2 | 5/2013 | Hsu et al. | |
| 9,063,018 B1 * | 6/2015 | Ghantous | G01K 1/14 |
| 9,726,554 B1 * | 8/2017 | Ghantous | G01K 13/00 |

(Continued)

FOREIGN PATENT DOCUMENTS

| CN | 1305590 A | 7/2001 |
|---|---|---|
| CN | 102411126 A | 4/2012 |

(Continued)

*Primary Examiner* — John H Le
(74) *Attorney, Agent, or Firm* — David B. Kelley; Brooks Kushman P.C.

(57) ABSTRACT

Vehicle systems and methods can include a traction battery and a controller to operate the traction battery according to current limits of a battery model identified from a battery response to a pulse of current injected into the battery while the battery is not being discharged to propel the vehicle or being charged. The pulse can have a sampling time and magnitude. The response is battery terminal voltages measurements at every sampling time during a set duration. The controller can implement a state estimator configured to output battery state uses a battery impulse response. The pulse input into the battery can be a current signal and the measured battery response can be a voltage. The controller can select a time period for the pulse input and battery measurement response to be when the controller is not charging the battery or drawing current from the battery to propel the vehicle.

8 Claims, 9 Drawing Sheets

(56) References Cited

U.S. PATENT DOCUMENTS

| | | | |
|---|---|---|---|
| 2011/0231124 A1* | 9/2011 | Itabashi | G01R 31/3651 702/63 |
| 2011/0254504 A1* | 10/2011 | Haddad | B60L 11/1827 320/109 |
| 2012/0098481 A1 | 4/2012 | Hunter et al. | |
| 2012/0306504 A1* | 12/2012 | van Lammeren | G01R 31/3658 324/430 |
| 2015/0051853 A1* | 2/2015 | Baba | H01M 10/48 702/63 |
| 2015/0219726 A1* | 8/2015 | Lenz | G01R 31/3606 702/63 |
| 2016/0084913 A1* | 3/2016 | Lupo | G01R 31/3624 702/63 |

FOREIGN PATENT DOCUMENTS

| | | |
|---|---|---|
| CN | 102565712 A | 7/2012 |
| CN | 102914745 A | 2/2013 |
| CN | 103454592 A | 12/2013 |
| WO | 2009111478 A2 | 9/2009 |

\* cited by examiner

BATTERY SYSTEM IDENTIFICATION THROUGH IMPULSE INJECTION

TECHNICAL FIELD

Various embodiments relate to an electric vehicle and a method for determining the state of a battery, specifically, estimating using an impulse injection, and using the battery estimation to control the vehicle systems in view of the battery state.

BACKGROUND

Hybrid electric vehicles (HEV) utilize a combination of an internal combustion engine with an electric motor to provide motive power. This arrangement provides improved fuel economy over a vehicle that has only an internal combustion engine. One method of improving the fuel economy in an HEV is to shut down the engine during times that the engine operates inefficiently, and is not otherwise needed to propel the vehicle. In these situations, the electric motor is used to provide all of the power needed to propel the vehicle. When the driver power demand increases such that the electric motor can no longer provide enough power to meet the demand, or in other cases such as when the battery state of charge (SOC) drops below a certain level, the engine provides the motive power for the vehicle.

The HEV includes a battery management system that estimates values descriptive of the battery pack and/or battery cell present operating conditions. The battery pack and/or cell operating conditions include battery SOC, power fade, capacity fade, and instantaneous available power. The battery management system should be capable of estimating values during changing cell characteristics as cells age over the lifetime of the pack. The precise estimation of some values may improve performance and robustness, and may ultimately lengthen the useful lifetime of the battery pack.

SUMMARY

A vehicle can include a traction battery and at least one controller configured to operate the traction battery according to current limits of a battery model identified from a response of the battery to a pulse of current injected into the battery while the battery is not being discharged to propel the vehicle or being charged. In an example, the pulse has an associated set sampling time and magnitude. The response can be a collection of battery terminal voltages measured at every sampling time during a set duration. In an example, the set duration is long enough to gather a number of voltage measurements that are used to identify the battery model.

In an example, the controller is configured to produce a discrete space model of the traction battery and to convert the discrete space model to a continuous state space model. The current limits are based on the continuous state space model. The controller can be configured to use Eigendecomposition to transform the continuous state space model to derive mathematical expressions to estimate the battery current limits.

In an example, the controller can be configured to construct a Hankel matrix using the response, to decompose the Hankel matrix into a singular value, to identify discrete state space matrices from the singular value, to convert the discrete state space matrices into continuous state space matrices, to perform Eigendecomposition on the continuous state space matrices to derive mathematical expressions, and to compute the battery current limits using the mathematical expressions.

A vehicle can include a traction battery and at least one controller programmed to inject an impulse of electric current with a duration and a magnitude to the traction battery while the controller is not charging the battery or drawing current from the battery to propel the vehicle and while output voltage of the traction battery is stabilized, to measure impulse responses of voltage outputs at a set time step during a time period, to identify a battery dynamics model from the impulse responses, to transform the battery dynamics model to a state space model, to estimate battery current limits and available power limits based on the state space model, and to operate the traction battery according to the battery current limits and available power limits.

In an example, the battery dynamics model can be identified in a discrete state space model, and the discrete state space model is converted to a continuous state space model.

In an example, the state space model can include a diagonal system matrix including system Eigenvalues and wherein the battery dynamics model is transformed through Eigendecomposition.

In an example, the set time step can be short enough to resolve battery system dynamics information.

In an example, the time period can be long enough to identify battery system dynamics information.

In an example, the controller is configured to construct a Hankel matrix from the impulse responses, decompose the Hankel matrix into a singular value, identify state space matrices based on the singular value, convert the state space matrices into continuous forms of the state matrices, perform Eigendecomposition on the continuous forms of the state matrices, compute the battery current limits using Eigendecomposed forms of the state matrices, or combinations thereof.

A method for battery state estimation can include injecting a signal pulse into a traction battery while the battery is not being discharged to propel the vehicle or being charged, sensing a response of the traction battery to the pulse, and operating the traction battery according to battery current limits of a battery model identified from the response.

Sensing the response can include measuring impulse responses of voltage outputs at every time step during a time period, identifying a battery dynamics model from the measured impulse responses, transforming the battery dynamics model to a state space model having a diagonal system matrix including system Eigenvalues through Eigendecomposition, estimating the battery current limits and available power limits from a transformed system dynamics model, and operating the traction battery according to estimated battery current limits and available power limits, or combinations thereof.

The traction battery can include a plurality of cells, which can store electrical energy and can be subject to the pulse injection, measurement and control as described herein.

DETAILED DESCRIPTION

Figure 1:
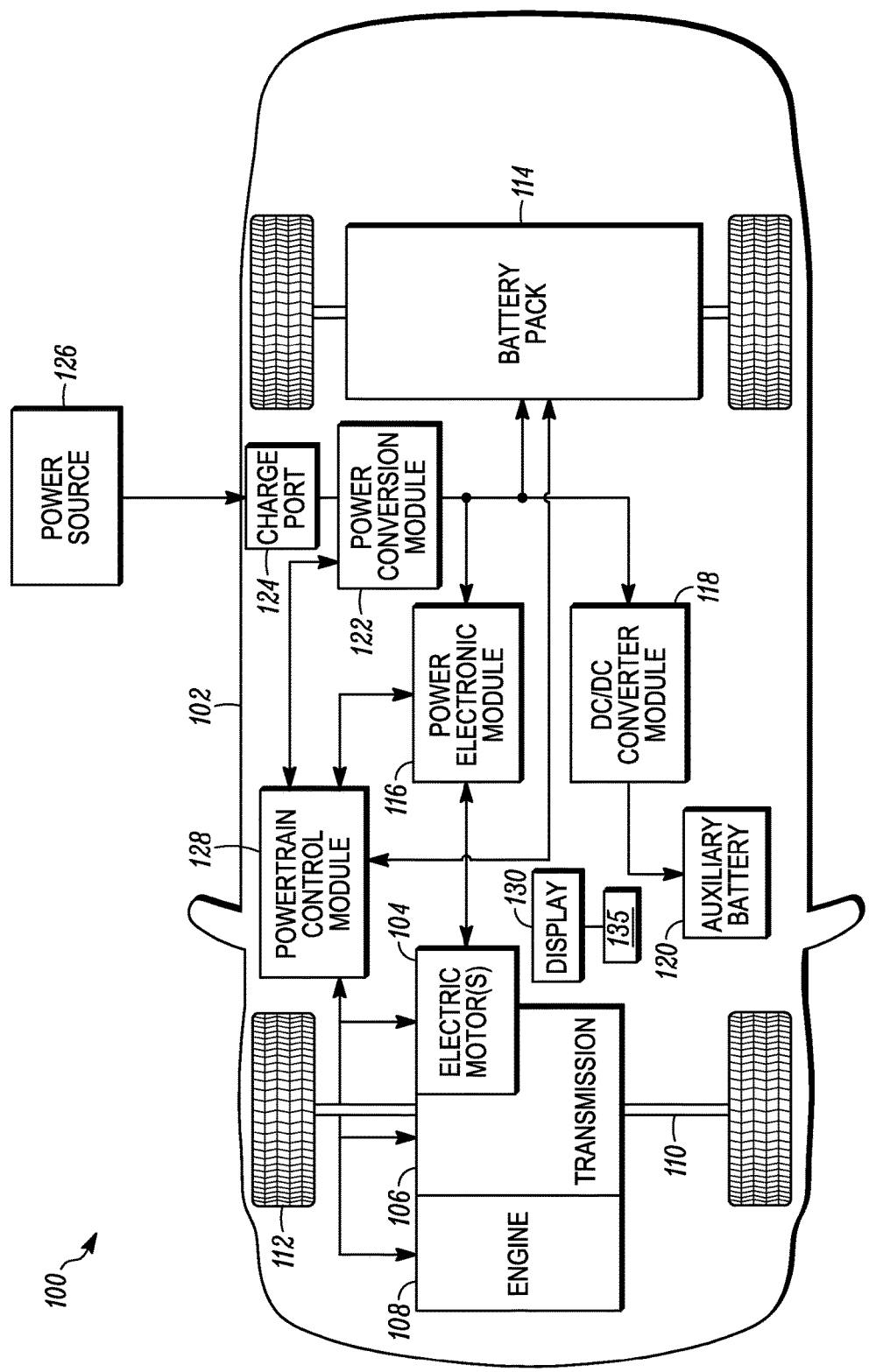
FIG. 1 is a hybrid electric vehicle that can be used with the described systems and methods.

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

The embodiments of the present disclosure generally provide for a plurality of circuits or other electrical devices. All references to the circuits and other electrical devices and the functionality provided by each, are not intended to be limited to encompassing only what is illustrated and described herein. While particular labels may be assigned to the various circuits or other electrical devices disclosed, such labels are not intended to limit the scope of operation for the circuits and the other electrical devices. Such circuits and other electrical devices may be combined with each other and/or separated in any manner based on the particular type of electrical implementation that is desired. It is recognized that any circuit or other electrical device disclosed herein may include any number of microprocessors, integrated circuits, memory devices (e.g., FLASH, random access memory (RAM), read only memory (ROM), electrically programmable read only memory (EPROM), electrically erasable programmable read only memory (EEPROM), or other suitable variants thereof) and software which co-act with one another to perform operation(s) disclosed herein. In addition, any one or more of the electric devices may be configured to execute a computer-program that is embodied in a non-transitory computer readable medium that is programmed to perform any number of the functions as disclosed.

As an overview, the present disclosure describes systems and methods to determine parameters of a traction battery and to control a vehicle. Battery model identification is important for battery management system (BMS) development in electrified vehicle applications, such as an Electric Vehicle (EV), a Plug-in Hybrid Electric Vehicle (PHEV), and a Full Hybrid Electric Vehicle (FHEV). In electrified vehicle applications, power capability prediction in real-time is used for preventing battery damage and failure modes caused by overcharging and over-discharging. However, the battery model identification needs not always be executed, since the battery model parameter change is not so fast to be updated real time. Thus, if the identification can be executed on demand, it will be sufficient for most purposes. The identification process should be done within a short time period; as a result a simpler and more convenient process to identify the battery would be helpful. The present disclosure describes an approach for identifying the battery system through impulse injection to the battery system and a subsequent process of the impulse response from the battery system. If the battery system is observable and controllable, the battery system can be identified from the inputs and the corresponding outputs. The impulse responses in the discrete time domain can be represented as "Markov parameters", and the system state space expressions are determined from the Markov parameters. The obtained discrete state space model can be converted to the continuous state space model in order to derive the expression for battery current limit computation. Eigendecomposition is then used to process the continuous state space model and to derive a general expression for battery current limit prediction parameter. The proposed approach can be readily applied to the battery system due to its simplicity and short identification time as compared to prior methods.

FIG. 1 depicts an example of a hybrid-electric vehicle 102, e.g., plug-in hybrid-electric vehicle. A plug-in hybrid-electric vehicle 102 may comprise one or more electric motors 104 mechanically connected to a hybrid transmission 106. In addition, the hybrid transmission 106 is mechanically connected to an engine 108. The hybrid transmission 106 may also be mechanically connected to a drive shaft 110 that is mechanically connected to the wheels 112. The electric motors 104 can provide torque to the wheels when the engine 108 is turned on. Electric motor 104 consumes electrical energy, e.g., from a battery 114, to provide torque to propel the vehicle 102. The electric motors 104 can provide deceleration capability when the engine 108 is turned off. The electric motors 104 may be configured as generators and can provide fuel economy benefits by recovering energy that would normally be lost as heat in the friction braking system. The electric motors 104 may also reduce pollutant emissions since the hybrid electric vehicle 102 may be operated in electric mode under certain conditions.

The traction battery or battery pack 114 stores energy that can be used by the electric motors 104. A vehicle battery pack 114 typically provides a high voltage DC output. The battery output is made in response to a battery power request, which can be calculated from the feedforward battery power value as a function of the driver power request and the engine power request, which in turn can be based on the speed and torque determinations. The battery pack 114 is electrically connected to a power electronics module 116. The power electronics module 116 is also electrically connected to the electric motors 104 and provides the ability to bi-directionally transfer energy between the battery pack 114 and the electric motors 104. For example, a typical battery pack 14 may provide a DC voltage while the electric motors 104 may require a three-phase AC current to function. The power electronics module 116 may convert the DC voltage to a three-phase AC current as required by the electric motors 104. In a regenerative mode, the power electronics module 116 will convert the three-phase AC current from the electric motors 104 acting as generators to the DC voltage required by the battery pack 114. The methods described herein are equally applicable to a pure electric vehicle or any other device using a battery pack. The battery 114 can experience degradation during certain uses of the vehicle. One use in which degradation occurs is storage at a high state of charge (SOC). Temperature can also be a factor in degradation Battery degradation is individualized for a specific type of battery. Battery degradation can include the inability of a battery 114 to hold a quantity of charge, e.g., less kW-hour or amp-hours are stored in the battery 114. In an example, the power control module 116 includes processors, memory, sensors and other circuitry to apply an electrical pulse to the battery 114 and measure its response to the electrical pulse to identify the battery and derive meaning parameters relating to the battery. See FIG. 5 and related description for an example of an input pulse and response signal. These battery parameters are then used by vehicle controls, e.g., the power electronic module 116, the powertrain control module 128, or other to control vehicle functions.

In addition to providing energy for propulsion, the battery 114 (or battery pack) may provide energy for other vehicle electrical systems. A typical system may include a DC/DC converter module 118 that converts the high voltage DC output of the battery pack 114 to a low voltage DC supply that is compatible with other vehicle loads. Other high voltage loads, such as compressors and electric heaters, may be connected directly to the high-voltage bus from the battery pack 114. In a typical vehicle, the low voltage systems are electrically connected to a 12V battery 120. An all-electric vehicle may have a similar architecture but without the engine 108.

The battery pack 114 may be recharged by an external power source 126. The battery charge storage status can be measured as state of charge. The external power source 126 may provide AC or DC power to the vehicle 102 by electrically connecting through a charge port 124. The charge port 124 may be any type of port configured to transfer power from the external power source 126 to the vehicle 102. The charge port 124 may be electrically connected to a power conversion module 122. The power conversion module may condition the power from the external power source 126 to provide the proper voltage and current levels to the battery pack 114. In some applications, the external power source 126 may be configured to provide the proper voltage and current levels to the battery pack 114 and the power conversion module 122 may not be necessary. The functions of the power conversion module 122 may reside in the external power source 126 in some applications. The vehicle engine, transmission, electric motors, battery, power conversion and power electronics may be controlled by a powertrain control module (PCM) 128.

In addition to illustrating a plug-in hybrid vehicle, FIG. 1 can illustrate a battery electric vehicle (BEV) if component 108 is removed. Likewise, FIG. 1 can illustrate a traditional hybrid electric vehicle (HEV) or a power-split hybrid electric vehicle if components 122, 124, and 126 are removed. FIG. 1 also illustrates the high voltage system which includes the electric motor(s), the power electronics module 116, the DC/DC converter module 118, the power conversion module 122, and the battery pack 114. The high voltage system and battery pack includes high voltage components including bus bars, connectors, high voltage wires, and circuit interrupt devices.

Vehicle 100 further includes a display 130 that can show data regarding the state of the vehicle, e.g., state of the electrical system and battery 114, as well as vehicle use/ non-use data. A data generator 135 can be connected to the display to compute and organize the data for the display 130. In an example, the display 130 can show the battery state as estimated or determined as described herein.

Figure 2:
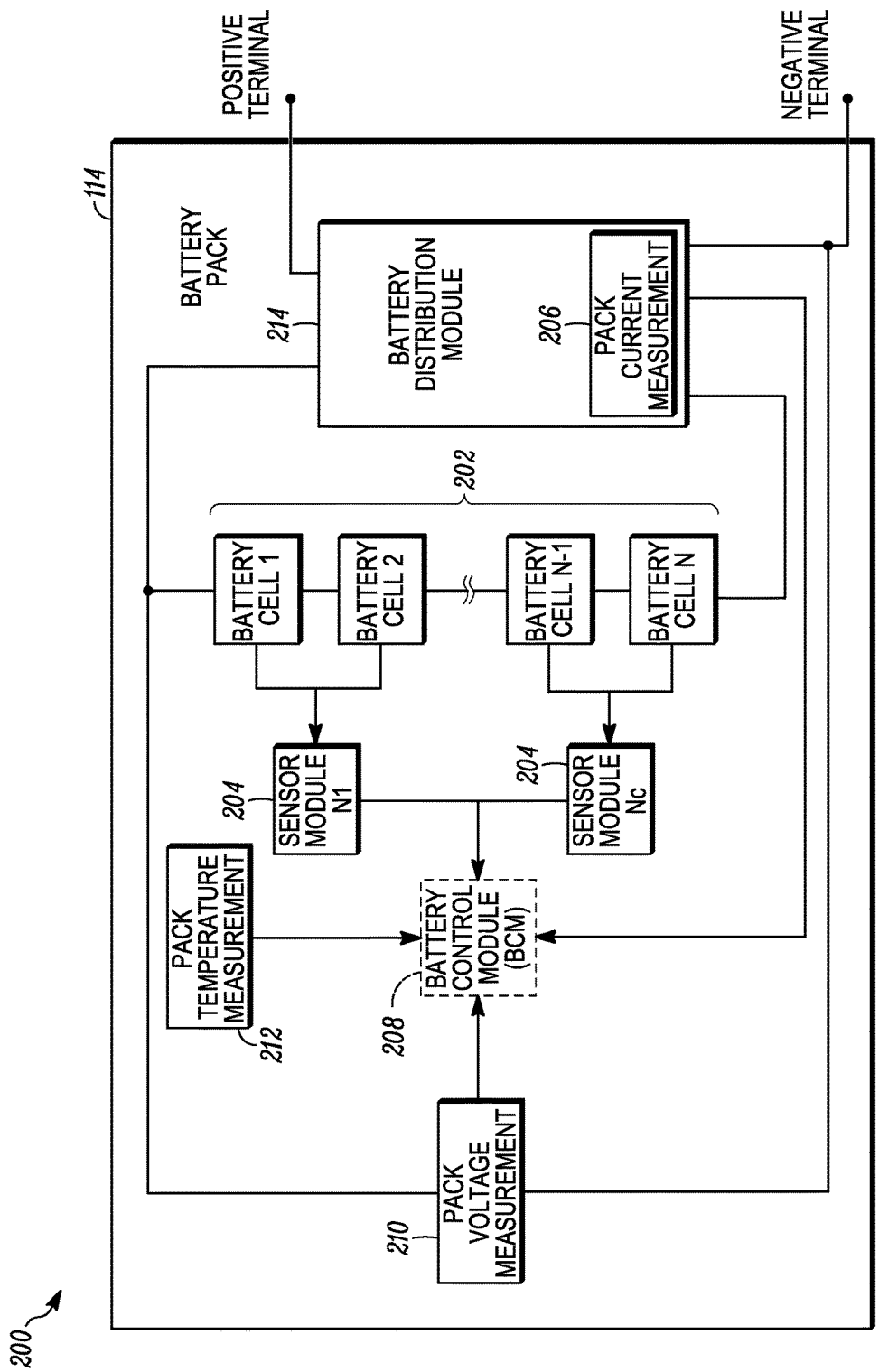
FIG. 2 is a detailed view of the battery for a hybrid electric vehicle.

The individual battery cells within a battery pack may be constructed from a variety of chemical formulations. Typical battery pack chemistries may include but are not limited to lead acid, nickel cadmium (NiCd), nickel-metal hydride (NIMH), Lithium-Ion or Lithium-Ion polymer. FIG. 2 shows a typical battery pack 200 in a simple series configuration of N battery cell modules 202. The battery cell modules 202 may contain a single battery cell or multiple battery cells electrically connected in parallel. The battery pack, however, may be composed of any number of individual battery cells and battery cell modules connected in series or parallel or some combination thereof. A typical system may have one or more controllers, such as a Battery Control Module (BCM) 208 that monitors and controls the performance of the battery pack 200. The BCM 208 may monitor several battery pack level characteristics such as pack current measured by a current sensor 206, pack voltage 210 and pack temperature 212. The performance of the current sensor 206 may be essential, in certain arrangements, to build a reliable battery monitoring system. The accuracy of the current sensor may be useful to estimate the battery state of charge and capacity. A current sensor may utilize a variety of methods based on physical principles to detect the current including a Hall effect IC sensor, a transformer or current clamp, a resistor in which the voltage is directly proportional to the current through it, fiber optics using an interferometer to measure the phase change in the light produced by a magnetic field, or a Rogowski coil. In the event a battery cell is charging or discharging such that the current entering or exiting the battery cell exceeds a threshold, the battery control module may disconnect the battery cell via the use of a circuit interrupt device (CID) such as a fuse or circuit breaker.

In addition to the pack level characteristics, there may be battery cell level characteristics that need to be measured and monitored. For example, the terminal voltage, current, and temperature of each cell may be measured. A system may use a sensor module 204 to measure the characteristics of one or more battery cell modules 202. The characteristics may include battery cell voltage, temperature, age, number of charge/discharge cycles, etc. Typically, a sensor module will measure battery cell voltage. Battery cell voltage may be voltage of a single battery or of a group of batteries electrically connected in parallel or in series. The battery pack 200 may utilize up to $N_c$ sensor modules 204 to measure the characteristics of all the battery cells 202. Each sensor module 204 may transfer the measurements to the BCM 208 for further processing and coordination. The sensor module 204 may transfer signals in analog or digital form to the BCM 208. The battery pack 200 may also contain a battery distribution module (BDM) 214 which controls the flow of current into and out of the battery pack 200.

In an example, the battery control module 208 includes processors, memory, sensors and other circuitry to apply an electrical pulse to the battery 202 and measure its response to the electrical pulse to identify the battery and derive meaning parameters relating to the battery. In an example, the sensor modules 204 can sense the battery response to the input pulse. See FIG. 5 and related description for an example of an input pulse and response signal. The identified battery parameters (or models) are then used by vehicle controls, e.g., the battery control module 208, the power electronic module 116, the powertrain control module 128, or other to control vehicle functions.

Figure 3:
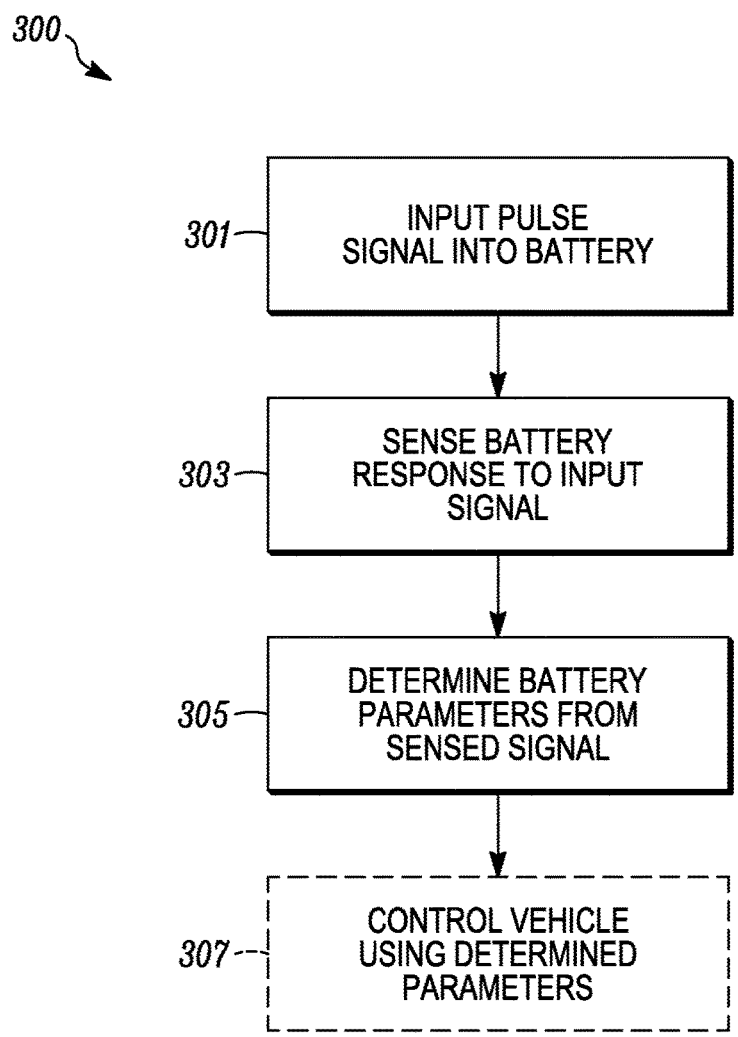
FIG. 3 is a flow chart of a method according to various examples.

FIG. 3 shows a method 300 for determining a battery state using an injection signal. At 301, an impulse signal with a predefined duration and magnitude is injected into the battery. The signal may be injected into the battery at a quiet period for the battery, i.e., battery responses are in a steady or quasi steady status. A quiet period is a period when the battery is not being charged by either regenerative sources or an external source and the battery is not supplying electrical power to the vehicle. The predefined duration of the injected signal can be a 0.1 second in an example. The duration may be short enough to represent dominant battery dynamics. The amplitude of the current can be one amp +/−0.5 amp in an example. In another example, the maximum current of the injection signal is five amps.

At 303, the battery response to the injected input signal is sensed and stored in the memory of the BCM. The sensing period may be long enough to measure the sufficient amount of measurements to identify a battery model. In an example, the end of the sensing period is 20 seconds in an example, and the period may be long enough to gather sufficient measurements. Sensing the battery response can be performed by a voltage sensor at the terminals of the battery. With injecting a current signal into the battery, there will be a voltage response to that current signal.

At 305, a battery model is identified from a set of sensed battery responses, e.g., a set of battery voltage responses. The identified model may be expressed as a state space form expressed as $$x(k+1) = A_d x(k) + B_d u(k) \tag{1a}$$

$$y(k) = C_d x(k) + D_d u(k) \tag{1b}$$

At 307, an optional step of controlling the vehicle using the identified battery model and estimated battery responses from the model is performed.

Figure 4:
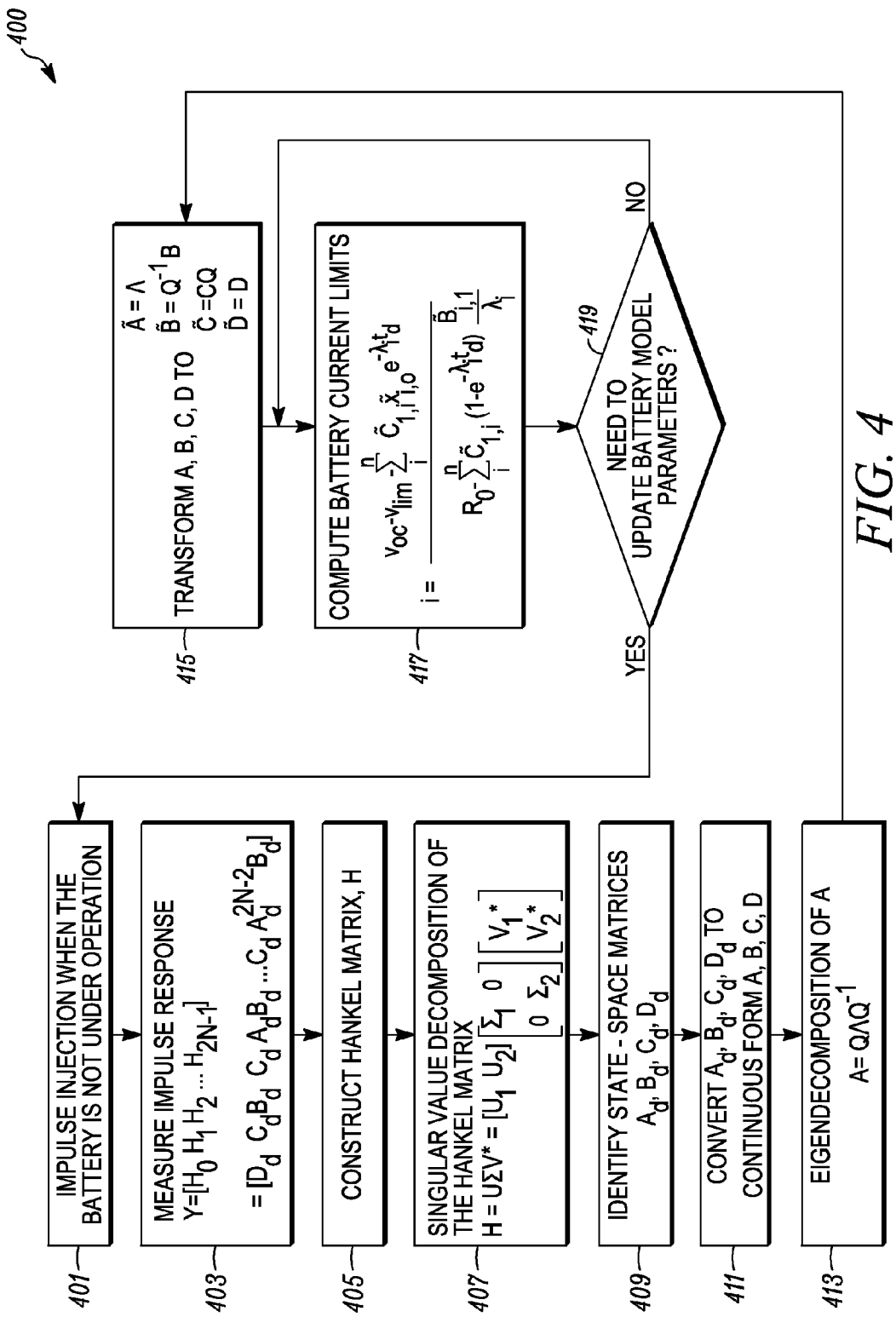
FIG. 4 is a flow chart of a method according to various examples.

FIG. 4 shows a method flow 400 of an embodiment for battery parameter estimation. At 401, an impulse current with a predefined duration and magnitude is injected into the battery at its terminals or at a cell of the battery. The signal is injected at a time that the battery is not supplying power to the electric motor of the vehicle or being charged by the electric motor or other source. That is, the electrical signals at the battery terminals are essentially neutral or at ground when the impulse signal is applied at the battery terminals.

At 403, a set of battery responses resulting from the injected impulse is measured and stored in the memory of the BCM. The measured response at a time $t=t_i$ is $H_{i-1}$. $t_i$ is the $i^{th}$ discrete sampling time expressed as $$t_i = t_0 + i\Delta t \tag{2}$$

where $\Delta t$ is a predetermined sampling time small enough to resolve dominant battery dynamics.

A set of battery responses based on equation (1a) and equation (1b) is expressed as $$y = [H_0, H_1, H_2, \ldots H_{2N-1}] \tag{3a}$$

$$= [D_d, C_d B_d, C_d A_d B_d, \ldots C_d A_d^{2N-2} B_d] \tag{3b}$$

The total number of measurement is 2N.

At 405, a matrix H, e.g., a Hankel matrix, is constructed from the set of measured battery responses in equation (3a) expressed as $$H = \begin{bmatrix} H_1 & H_2 & H_3 & \ldots & H_N \\ H_2 & H_3 & H_4 & \ldots & H_{N+1} \\ H_3 & H_4 & H_5 & \ldots & H_{N+2} \\ \vdots & \vdots & \vdots & \ddots & \vdots \\ H_N & H_{N+1} & H_{N+2} & \ldots & H_{2N-1} \end{bmatrix} \tag{4}$$

$$= \begin{bmatrix} C_d B_d & C_d A_d B_d & C_d A_d^2 B_d & \ldots & C_d A_d^{N-1} B_d \\ C_d A_d B_d & C_d A_d^2 B_d & C_d A_d^3 B_d & \ldots & C_d A_d^N B_d \\ C_d A_d^2 B_d & C_d A_d^3 B_d & C_d A_d^4 B_d & \ldots & C_d A_d^{N+1} B_d \\ \vdots & \vdots & \vdots & \ddots & \vdots \\ C_d A_d^{N-1} B_d & C_d A_d^N B_d & C_d A_d^{N+1} B_d & \ldots & C_d A_d^{2N-2} B_d \end{bmatrix}$$

At 407, the matrix is decomposed, e.g., using a singular value decomposition to identify dominant dynamics of the battery system. An example is $$H = U\Sigma V^* = [U_1, U_2]\begin{bmatrix} \Sigma_1 & 0 \\ 0 & \Sigma_2 \end{bmatrix}\begin{bmatrix} V_1^* \\ V_2^* \end{bmatrix}, \tag{5}$$

where $\Sigma_1$ is set to an n-by-n matrix that includes the first n largest eigenvalues. $U_1$ is determined to an N-by-n matrix. $V_1$ is determined to an n-by-N matrix. In a battery model, the number of inputs is one and the number of outputs is one. Accordingly, $U_1$ and $V_1$ can be set as follows:

$$U_1 = \begin{bmatrix} U_{11} \\ U_{12} \\ U_{13} \end{bmatrix} \tag{6}$$

$$V_1 = [V_{11} \ V_{12} \ V_{13}] \tag{7}$$

where $U_{11}$ and $U_{13}$ are set to 1-by-n matrices, $V_{11}$ and $V_{13}$ are set to n-by-1 matrices. This can now be used in the Hankel matrix as follows:

$$H = \begin{bmatrix} C_d B_d & C_d A_d B_d & C_d A_d^2 B_d & \ldots & C_d A_d^{N-1} B_d \\ C_d A_d B_d & C_d A_d^2 B_d & C_d A_d^3 B_d & \ldots & C_d A_d^N B_d \\ C_d A_d^2 B_d & C_d A_d^3 B_d & C_d A_d^4 B_d & \ldots & C_d A_d^{N+1} B_d \\ \vdots & \vdots & \vdots & \ddots & \vdots \\ C_d A_d^{N-1} B_d & C_d A_d^N B_d & C_d A_d^{N+1} B_d & \ldots & C_d A_d^{2N-2} B_d \end{bmatrix} \tag{8}$$

$$= [C_d \ C_d A_d \ C_d A_d^2 \ \ldots \ C_d A_d^{N-1}]^T$$

$$[B_d \ A_d B_d \ A_d^2 B_d \ \ldots \ A_d^{N-1} B_d]$$

$$= O_N C_N$$

$\Sigma_2$ is a small enough value to allow $\Sigma_2$ to be set to 0 in the calculation. As a result the matrix H is reduced to $$H = U_1 \Sigma_1 V_1^* = (U_1 \Sigma_1^{1/2})(\Sigma_1^{1/2} V_1^*) \quad (9)$$

$$= \left( \begin{bmatrix} U_{11} \\ U_{12} \\ U_{13} \end{bmatrix} \Sigma_1^{1/2} \right) (\Sigma_1^{1/2} [V_{11}^* \quad V_{12}^* \quad V_{12}^*])$$

$$= O_N C_N$$

The H matrix is defined as follows $$H_A = \begin{bmatrix} U_{12} \\ U_{13} \end{bmatrix} \Sigma_1^{1/2} \Sigma_1^{1/2} [V_{11}^* \quad V_{12}^* \quad V_{12}^*] \quad (10)$$

$$= \begin{bmatrix} U_{11} \\ U_{12} \end{bmatrix} \Sigma_1^{1/2} A_d \Sigma_1^{1/2} [V_{11}^* \quad V_{12}^* \quad V_{12}^*]$$

$$= \begin{bmatrix} C_d A B_d & C_d A_d^2 B_d & C_d A_d^3 B_d & \cdots & C_d A_d^N B_d \\ C_d A_d^2 B_d & C_d A_d^3 B_d & C_d A_d^4 B_d & \cdots & C_d A_d^{N+1} B_d \\ C_d A_d^3 B_d & C_d A_d^4 B_d & C_d A_d^5 B_d & \cdots & C_d A_d^{N+2} B_d \\ \vdots & \vdots & \vdots & \ddots & \vdots \\ C_d A_d^{N-1} B_d & C_d A_d^N B_d & C_d A_d^{N+1} B_d & \cdots & C_d A_d^{2N-2} B_d \end{bmatrix}$$

At 409 the state space matrices $A_d$, $B_d$, $C_d$, and $D_d$ for the battery can be identified. From these battery parameters can be determined in the vehicle modules or controls. The $H_A$ equation above can be reduced to define $A_d$ as follows $$A_d = \Sigma_1^{-1/2} \begin{bmatrix} U_{11} \\ U_{12} \end{bmatrix}^* \begin{bmatrix} U_{12} \\ U_{13} \end{bmatrix} \Sigma_1^{1/2} \quad (11)$$

From the above, $B_d$, $C_d$, and $D_d$ can be defined as follows $$B_d = \Sigma_1^{1/2} V_{11}^* \quad (12)$$

$$C_d = U_{11} \Sigma_1^{1/2} \quad (13)$$

$$D_d = H_0 \quad (14)$$

Thus, the state space matrices $A_d$, $B_d$, $C_d$, and $D_d$ are now identified.

From these the expression of the current limit from the battery can be identified. At 411, the discrete state space matrices are converted to continuous matrices.

From the continuous state-space expression $$\dot{x} = Ax + Bu$$

$$y = Cx + Du' \quad (15)$$

The discrete model is expressed as $$x_{k+1} = (I + A\Delta t)x_k + B\Delta t u_k \quad (16)$$

$$= A_d x_k + B_d u_k$$

$$y_k = C x_k + D u_k$$

$$= C_d x_k + D_d u_k$$

From the identified $A_d$, $B_d$, $C_d$, and $D_d$, a continuous state-space model is derived as $$A = (A_d - 1)/\Delta t, B = B_d / \Delta t, C = C_d, \text{ and } D = D_d.$$

Once converted to continuous form, Eigendecomposition is performed, at 413. The equation for Eigendecomposition can be $$A = Q \Lambda Q^{-1}, \quad (17)$$

where Q is the n×n matrix whose i-th column is the basis eigen vector $q_i$. $\Lambda$ is the diagonal matrix whose diagonal elements are corresponding Eigen values.

The transformed state vector expressed by the Eigenvectors is computed by $$\tilde{x} = Q^{-1} x.$$

At 415, the transformed state space matrices are determined by $$\tilde{A} = \Lambda \quad (18a)$$

$$\tilde{B} = Q^{-1} B \quad (18b)$$

$$\tilde{C} = CQ \quad (18c)$$

$$\tilde{D} = D \quad (18d)$$

$$\text{where } \Lambda = \begin{bmatrix} \lambda_1 & 0 & \cdots & & 0 \\ 0 & \ddots & \ddots & & \\ \vdots & \ddots & \lambda_i & & \vdots \\ & & & \ddots & 0 \\ 0 & & \cdots & 0 & \lambda_n \end{bmatrix} \quad (19)$$

Now that the transformed state space matrices are set, the battery model is identified, e.g., at 415. This can be done with the following equations $$\dot{\tilde{x}}_i = -\lambda_i \tilde{x}_i + \tilde{B}_{i,1} u \quad (20a)$$

$$y = \sum_i \tilde{C}_{1,i} \tilde{x}_i + \tilde{D} u \quad (20b)$$

where $y = v_{oc} - v_t = v_1 + v_2$ and $u = i$.

In practical applications the internal resistance, $R_0$, can be computed as follows $$H_0 = R_0 = D = \frac{1}{T} \int_{t_0}^{t_0+T} y \, dt \Big/ \frac{1}{T} \int_{t_0}^{t_0+T} i \, dt \quad (21)$$

At 417, this equation can be used to determine battery current limits during the time duration $t = t_d$. This results in $$i = \frac{v_{OC} - v_{lim} - \sum_i \tilde{C}_{1,i} \tilde{x}_{i,0} e^{-\lambda_i t_d}}{R_0 - \sum_i \tilde{C}_{1,i}(1 - e^{-\lambda_i t_d}) \frac{\tilde{B}_{i,1}}{\lambda_i}} \quad (22)$$

When n=2, the equation is expressed as $$i = \frac{v_{OC} - v_{lim} - \tilde{C}_{1,1} \tilde{x}_{1,0} e^{-\lambda_1 t_d} - \tilde{C}_{1,2} \tilde{x}_{2,0} e^{-\lambda_2 t_d}}{R_0 - \tilde{C}_{1,1}(1 - e^{-\lambda_1 t_d}) \frac{\tilde{B}_{1,1}}{\lambda_1} - \tilde{C}_{2,1}(1 - e^{-\lambda_2 t_d}) \frac{\tilde{B}_{2,1}}{\lambda_2}} \quad (23)$$

The power limit can be calculated by the following for the charge state and the discharge state of the battery:

$$P_{lim}=|i_{min}|v_{ub} \quad (24a)$$

$$P_{lim}=|i_{max}|v_{lb}, \quad (24b)$$

where $P_{lim}$ is the power capability, $v_{ub}$ is the battery upper voltage limit, and $i_{min}$ is the absolute minimum current. In the discharge state, $i_{max}$ is the maximum current that can be drawn from the battery. Thus the system may calculate the battery instantaneous power capabilities during a charge event or discharge event.

At 419, the decision whether the battery model parameters need to be updated is made. This can be decision can be triggered based on time since the last update. In another example, the vehicle condition or use can be used to trigger the update. The update time can be set to one or two hours of vehicle runtime. In an example, the update occurs once a day. In another example, the time can be based on the age of the battery, e.g., as the battery gets older the time to update is shortened.

Figure 5:
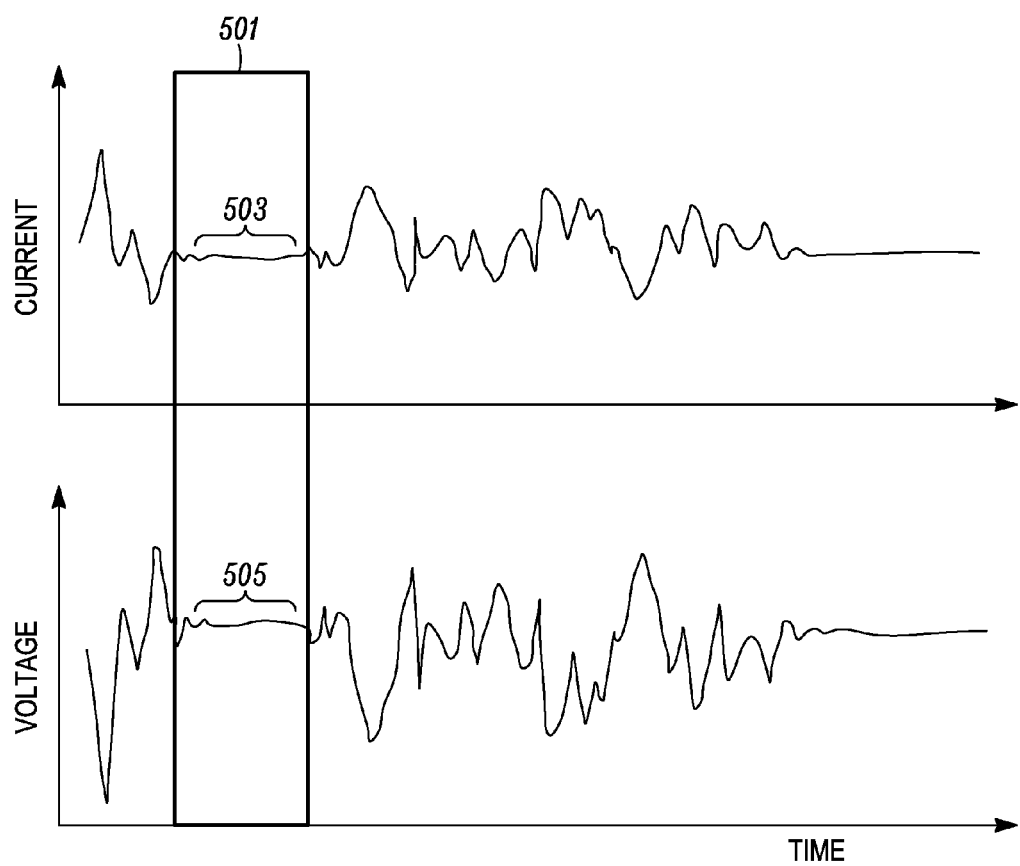
FIG. 5 shows time aligned graphs of an impulse injection and response according to an example.

FIG. 5 shows a graph of an impulse injection input and response. A time period 501 where the battery is neither being commanded to supply electrical energy to the motor or being charged from a regenerative source or an external electrical power source. A shown the time period 501 includes a non-measurement period at its beginning where the signal includes some transients. After the transients subside, the current impulse injection period 503 occurs ($i=\delta$). At the same time as the current impulse injection period 503 occurs, the voltage response measurement period 505 occurs. The impulse current signal applied to the battery in the period 503 has a predetermined time duration equal to the sampling time of measurements. In an example, the injected pulse duration is 0.1 second, and the sampling time of the measurements is 0.1 second. The injected current signal may have a high current (not shown in FIG. 5) to obtain battery responses less sensitive to the measurement noises and is injected closer to the beginning of the time period 503 to allow sufficient or maximum time to measure the responses in the response measurement period 505.

Figure 6A:
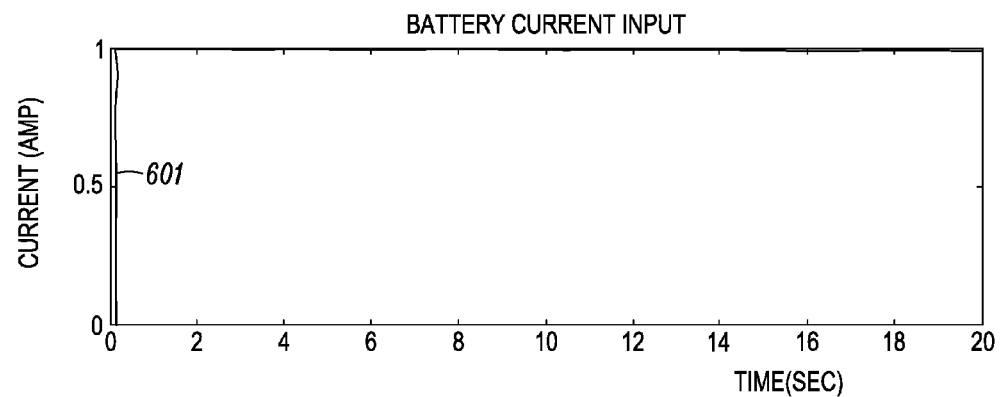
FIGS. 6A-6B show graphs of battery input current and battery terminal voltage according to an example.

FIG. 6A shows a graph of an input injection signal 601 that can be input into the battery. This graph is an example. The injected impulse duration is 0.1 second and the magnitude is 1 ampere. The battery terminal voltage is measured at every 0.1 second until the number of measurements is sufficient to identify the battery model.

Figure 6B:
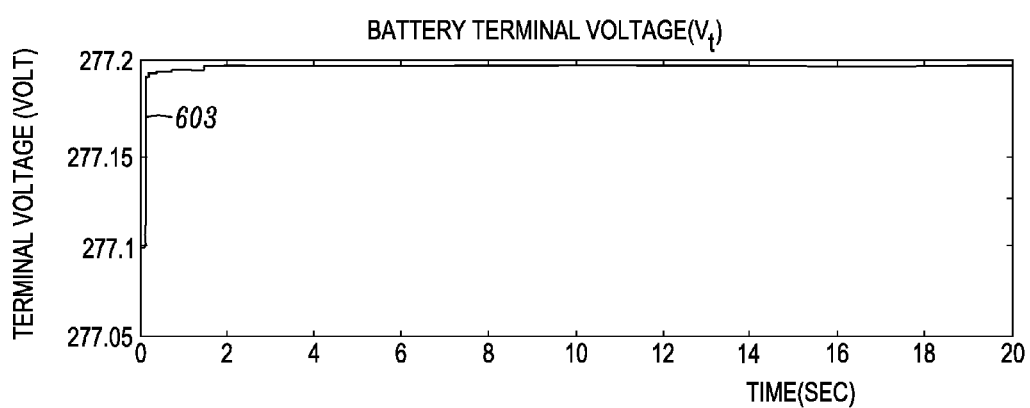

FIG. 6B shows a graph of the sensed battery terminal voltage 603 that results from the injected current pulse signal 601. In this example, the battery starts with a voltage of 277.1 volts when the input injection signal 601 is applied to the battery. The battery terminal voltage ($v_t$) rises to less than 277.2 volts and a set of the measured voltage signal can be used to identify a battery model, e.g., as described above. The battery terminal voltage 603 can be sensed for as long as the number of measurements is large enough to identify a battery model with a required accuracy.

Figure 7A:
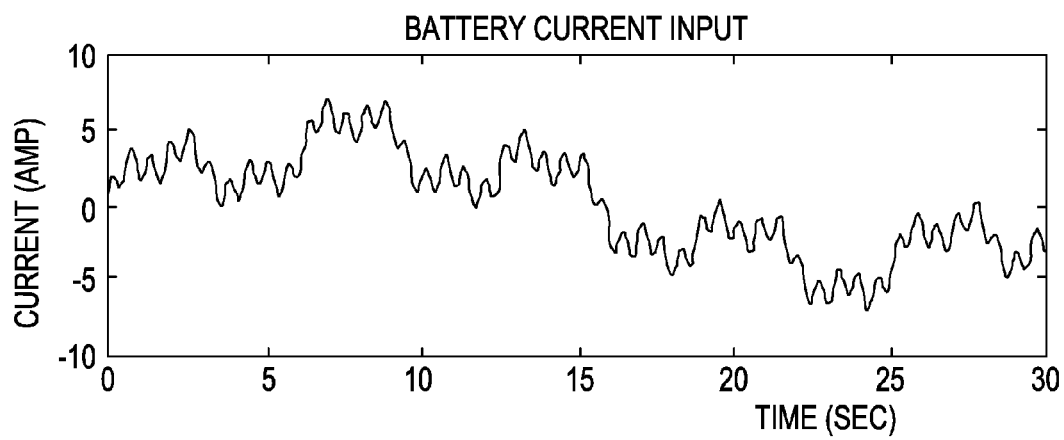
FIGS. 7A-7B show various graphs of battery input current and battery terminal voltage according to an example.

FIG. 7A shows a graph of battery input current as a function of time. The x axis is a time in second, and the y axis is a current in ampere. A current profile having multiple frequency component can be applied to a battery system.

Figure 7B:
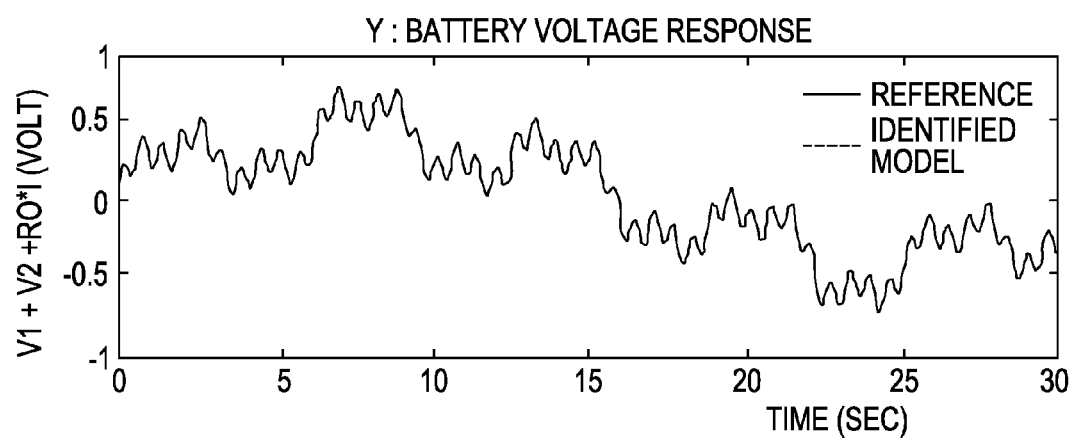

FIG. 7B shows a graph of battery voltages and compares $v_{ref}$, calculated by a reference battery model, and a model voltage, calculated by an identified model, as a function of time. The x axis is an time in second, and the y axis is a voltage response expressed as $v_{oc}-v_t-R_0 i$. As shown the model voltage, shown in dashed line, closely follows the reference voltage $v_{ref}$. For example, the Y scale is not large enough to show the identified battery model to be different than the reference signal.

Figure 8A:
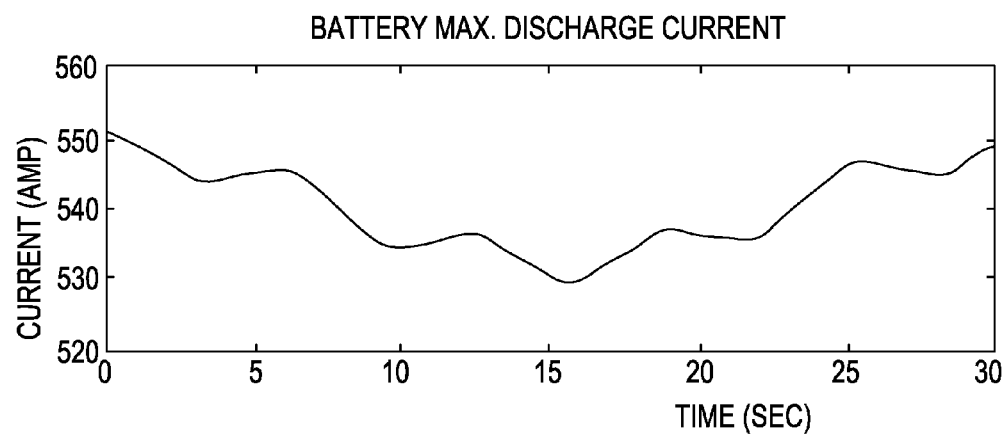
FIGS. 8A-8B are various graphs of battery maximum discharge current and battery maximum charge current according to an example.

FIG. 8A shows a graph of the calculated battery maximum discharge current as a function of time for an example embodiment. This calculation is performed using the structures and methods described herein. This graph and its underlying data can be used to control operation of a vehicle, e.g., an HEV 102.

Figure 8B:
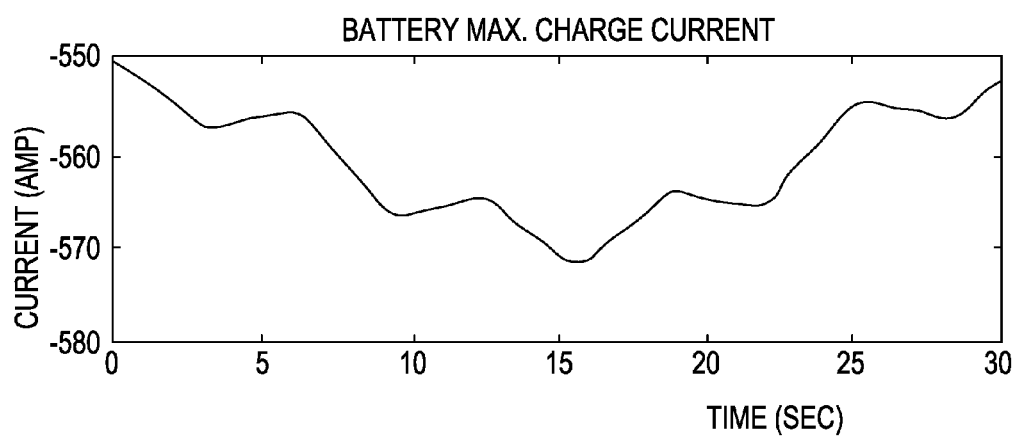

FIG. 8B shows a graph of the calculated battery maximum charge current as a function of time for an example embodiment. This calculation is performed using the structures and methods described herein. This graph and its underlying data can be used to control operation of a vehicle, e.g., an HEV 102.

Figure 9:
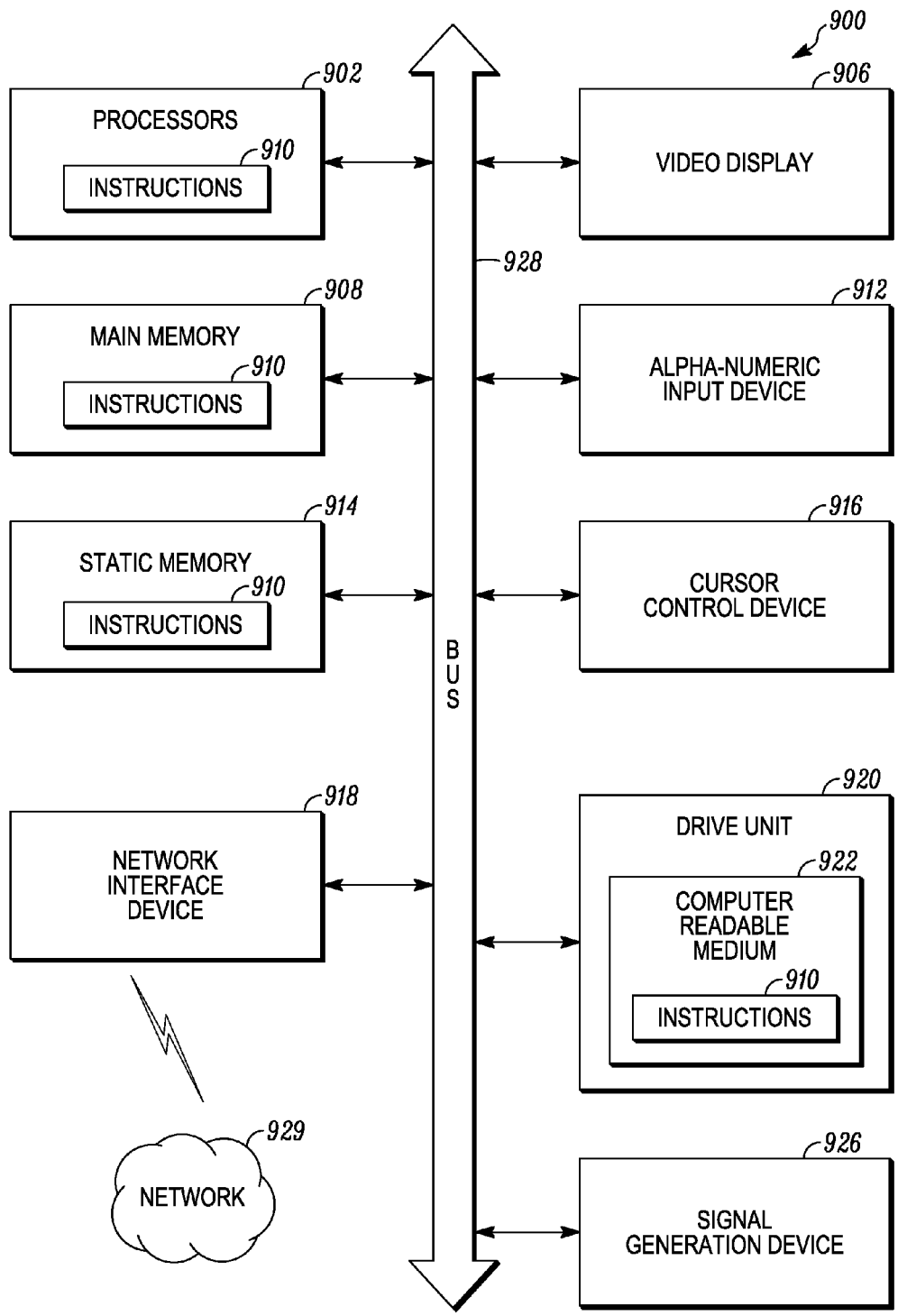
FIG. 9 shows a schematic view of a computing device for a vehicle.

FIG. 9 shows a diagrammatic representation of machine in the example form of a computer system 900 within which a set of instructions may be executed causing the machine to perform any one or more of the methods, processes, operations, or methodologies discussed herein. The HEV 102 can operate on one or more computer systems 900. The HEV 102 can include the functionality of one or more computer systems 900 or parts of the computer system 900.

In an example embodiment, the machine operates as a standalone device or may be connected (e.g., networked) to other machines. In a networked deployment, the machine may operate in the capacity of a server or a client machine in server-client network environment, or as a peer machine in a peer-to-peer (or distributed) network environment. The machine may be similar to or includes components of a server computer, a client computer, a personal computer (PC), a tablet PC, a set-top box (STB), a Personal Digital Assistant (PDA), a cellular telephone, a web appliance, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The example computer system 900 includes at least one processor 902 (e.g., a central processing unit (CPU) a graphics processing unit (GPU), auxiliary processors or combinations thereof), a main memory 908 and a static memory 914, which communicate with each other via a bus 928. The computer system 900 may further include a video display 906 (e.g., a liquid crystal display (LCD), light emitting diode (LED) or a cathode ray tube (CRT)). The display 906 can be on the vehicle driver instrument panel or otherwise mounted in the vehicle. The computer system 900 also includes an alphanumeric input device 912 (e.g., a keyboard or touchpad presenting a keyboard), a cursor control device 916 (e.g., a mouse, touch screen, joystick, track pad or the like), a drive unit 920, a signal generation device 926 (e.g., a speaker, horn or tone generator) and a network interface device 918.

The drive unit 920 includes a machine-readable medium 922 on which is stored one or more sets of instructions 910 (e.g., software) embodying any one or more of the methodologies or functions described herein. The instructions 910 may also reside, completely or at least partially, within the main memory 904 and/or within the processor 902 during execution thereof by the computer system 900. The main memory 908 and the processor 902 also constituting machine-readable media.

The software, e.g., instructions 910, may further be transmitted or received over a network 924 via the network interface device 918 via communication protocols that can code and decode data for transmission. The software instructions 910 can also be communicated over the bus 928.

While the machine-readable medium, e.g., element 922, is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing, encoding or carrying a set of instructions for execution by the machine and that cause the machine to perform any one or more of the methodologies of the embodiments of the present invention. Such media can include tangible media. The term "machine-readable medium" shall accordingly be taken to include, but not be limited to, buses, tangible carrier wave signals, solid-state memories, and optical and magnetic media In electrified vehicle applications, power capability prediction in real-time is important for preventing battery damage and failure modes caused by overcharging and over-discharging. A battery can be modeled to allow battery management system, e.g., the vehicle processors, circuitry, modules or controller, to reduce the likelihood of damage or failure. A battery management system in electrified vehicle applications, such as Electric Vehicle (EV), Plug-in Hybrid Electric Vehicle (PHEV), and Full Hybrid Electric Vehicle (FHEV) may use battery model identification. However, the battery model identification needs not to be continuously executed, since the model parameter change is not so fast continuously. Thus, if the battery model identification can be executed on demand. However, the identification process should be done within a short period and in real-time once started, so that simpler and more efficient computational schemes can be used as the process is carried out on the vehicle. The present disclosure describes an approach for identifying the battery system through subspace identification approaches.

The battery model identification as described herein uses using a current injection method. As described herein the battery system dynamics can be expressed without throughput of the current. Only an injection of a current signal into the battery is needed. The battery system can be modeled including an internal resistance $R_0$, which is typically represented as a D matrix. By extracting this from the system response for the injection signal, it is believed that the system model can be identified with a simpler from and improved accuracy. As a result, the identification problem is separated into two parts: $R_0$ estimation and system dynamics estimation.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A vehicle comprising:
    a traction battery including terminals and battery cells; and
    at least one controller to:
        inject a current impulse at the terminals while the traction battery is not being discharged or charged,
        sense an output from the terminals after injecting the impulse, and
        operate the traction battery according to power limits defined by a battery model that is updated with the sensed output from the terminals.

2. The vehicle of claim 1 wherein the at least one controller is configured to produce a discrete space model of the traction battery and to convert the discrete space model to a continuous state space model.

3. The vehicle of claim 2 wherein the operational limits are based on the continuous state space model.

4. The vehicle of claim 3 wherein the at least one controller is configured to use Eigendecomposition to transform the continuous state space model to derive mathematical expressions to estimate the power limits.

5. The vehicle of claim 1 wherein the at least one controller injects the current impulse during a current pulse injection period that is free from battery transients.

6. The vehicle of claim 5 wherein the sensing occurs during the current pulse injection period.

7. The vehicle of claim 6 wherein the current impulse has an amplitude of 1 ampere and a duration of 0.1 second.

8. The vehicle of claim 1, wherein the battery model includes a state space model.

\* \* \* \* \*